United States Patent
Iyengar et al.

(10) Patent No.: US 12,315,782 B2
(45) Date of Patent: May 27, 2025

(54) SPRING LOADED COMPLIANT COOLANT DISTRIBUTION MANIFOLD FOR DIRECT LIQUID COOLED MODULES

(71) Applicant: Google LLC, Mountain View, CA (US)

(72) Inventors: Madhusudan K. Iyengar, Foster City, CA (US); Connor Burgess, Alameda, CA (US); Emad Samadiani, Mountain View, CA (US); Padam Jain, San Jose, CA (US); Jorge Padilla, Union City, CA (US); Feini Zhang, Sunnyvale, CA (US); Yuan Li, Sunnyvale, CA (US)

(73) Assignee: Google LLC, Mountain View, CA (US)

( * ) Notice: Subject to any disclaimer, the term of this patent is extended or adjusted under 35 U.S.C. 154(b) by 358 days.

(21) Appl. No.: 16/879,101

(22) Filed: May 20, 2020

(65) Prior Publication Data

US 2021/0366806 A1   Nov. 25, 2021

(51) Int. Cl.
*H01L 23/433* (2006.01)
*F28F 9/02* (2006.01)
*H05K 7/20* (2006.01)

(52) U.S. Cl.
CPC .......... *H01L 23/433* (2013.01); *F28F 9/0251* (2013.01); *H05K 7/20272* (2013.01); *F28F 2225/08* (2013.01)

(58) Field of Classification Search
CPC .......... H01L 2023/4043; H01L 23/433; H05K 7/20272
See application file for complete search history.

(56) References Cited

U.S. PATENT DOCUMENTS

| 4,721,996 A | * | 1/1988 | Tustaniwskyj ...... H01L 23/4093 257/713 |
| 5,294,830 A | * | 3/1994 | Young ................. H01L 23/4735 361/689 |
| 5,309,319 A | | 5/1994 | Messina |

(Continued)

FOREIGN PATENT DOCUMENTS

| CN | 101103659 A | 1/2008 |
| CN | 102014598 B | 3/2013 |

(Continued)

OTHER PUBLICATIONS

Extended European Search Report for European Patent Application No. 20211087.0 dated Sep. 15, 2021. 10 pages.

(Continued)

*Primary Examiner* — Eric S Ruppert
(74) *Attorney, Agent, or Firm* — Lerner David LLP

(57) ABSTRACT

Systems and methods for using spring force based compliance to minimize the bypass liquid flow gaps between the tops of chip microfins and bottom side of manifold ports are disclosed herein. A fluid delivery and exhaust manifold structure provides direct liquid cooling of a module. The manifold sits on top of a chip with flow channels. Inlet and outlet channels of the manifold in contact with flow channels of the chip creates an intricate crossflow path for the coolant resulting in improved heat transfer between the chip and the working fluid. The module is also designed with pressure reduction features using internal leakage flow openings to account for pressure differential between fluid entering and being expelled from the module.

7 Claims, 9 Drawing Sheets

(56) References Cited

U.S. PATENT DOCUMENTS

| | | | |
|---|---|---|---|
| 5,517,753 A * | 5/1996 | Messina | H01L 23/4006 |
| | | | 29/841 |
| 7,100,381 B2 * | 9/2006 | Hale | F28F 13/02 |
| | | | 62/304 |
| 7,190,580 B2 | 3/2007 | Bezama et al. | |
| 7,362,574 B2 * | 4/2008 | Campbell | H01L 23/4735 |
| | | | 165/80.4 |
| 8,027,162 B2 | 9/2011 | Campbell et al. | |
| 9,265,176 B2 * | 2/2016 | Arvelo | H01L 23/34 |
| 9,355,932 B2 | 5/2016 | Ankireddi et al. | |
| 9,564,385 B2 * | 2/2017 | Schmit | H01L 23/44 |
| 2004/0105234 A1 | 6/2004 | Messina et al. | |
| 2005/0151244 A1 | 7/2005 | Chrysler et al. | |
| 2005/0210906 A1 * | 9/2005 | Laufer | F28F 9/0253 |
| | | | 257/E23.1 |
| 2006/0087816 A1 * | 4/2006 | Ewes | H01L 23/427 |
| | | | 257/E23.088 |
| 2006/0108098 A1 | 5/2006 | Stevanovic et al. | |
| 2006/0250773 A1 * | 11/2006 | Campbell | H01L 23/4735 |
| | | | 165/80.4 |
| 2006/0250774 A1 * | 11/2006 | Campbell | H01L 23/4735 |
| | | | 361/699 |
| 2006/0279935 A1 | 12/2006 | Karidis et al. | |
| 2007/0050980 A1 * | 3/2007 | Vetter | B23K 11/14 |
| | | | 257/E23.098 |
| 2007/0272392 A1 * | 11/2007 | Ghosh | H01L 23/4336 |
| | | | 257/714 |
| 2008/0060792 A1 * | 3/2008 | Berger | H01L 23/4735 |
| | | | 165/80.4 |
| 2008/0245506 A1 | 10/2008 | Campbell et al. | |
| 2008/0264604 A1 | 10/2008 | Campbell et al. | |
| 2009/0283902 A1 | 11/2009 | Bezama et al. | |
| 2013/0255925 A1 | 10/2013 | Koontz et al. | |
| 2014/0190668 A1 * | 7/2014 | Joshi | H01L 23/4735 |
| | | | 165/104.19 |
| 2014/0284029 A1 * | 9/2014 | Yoshida | F28F 3/12 |
| | | | 165/104.31 |
| 2015/0043164 A1 * | 2/2015 | Joshi | G06F 1/20 |
| | | | 165/185 |
| 2016/0327996 A1 | 11/2016 | Sasabe et al. | |
| 2016/0365301 A1 * | 12/2016 | Takano | H01L 23/4735 |
| 2017/0196120 A1 * | 7/2017 | Oprins | H05K 5/06 |
| 2019/0045662 A1 * | 2/2019 | Schroeder | H05K 7/20272 |
| 2020/0352053 A1 * | 11/2020 | Mizerak | H01L 23/4735 |

FOREIGN PATENT DOCUMENTS

| | | | | |
|---|---|---|---|---|
| CN | 103988043 A | | 8/2014 | |
| CN | 110164835 A | * | 8/2019 | H01L 23/3672 |
| WO | WO-2005096377 A1 | * | 10/2005 | F28F 3/12 |

OTHER PUBLICATIONS

Office Action for Chinese Patent Application No. 202010986103.5 dated Sep. 13, 2023. 6 pages.

Office Action for Taiwanese Patent Application No. 109130777 dated Nov. 16, 2023. 5 pages.

Office Action for Taiwanese Patent Application No. 109130777 dated Jul. 31, 2023. 8 pages.

* cited by examiner

SPRING LOADED COMPLIANT COOLANT DISTRIBUTION MANIFOLD FOR DIRECT LIQUID COOLED MODULES

BACKGROUND

Complementary Metal Oxide Semiconductor ("CMOS") circuits are found in several types of electronic components, including microprocessors, batteries, and digital camera image sensors. The main features of CMOS technology are low static power consumption and high noise immunity.

In addition to industry standard chip packages, the exploration of special purpose silicon is likely to result in high power heat sources in servers. This technology may also be applied to graphics processing units ("GPUs") and custom application-specific integrated circuits ("ASICs"). Further, services such as imaging and artificial intelligence ("AI") will likely require large compute resources at a high density, with many servers in close proximity to one another. Data centers around the globe are being mandated to simultaneously increase energy efficiency, consolidate operations and reduce costs. To accommodate these high performance and high density servers, data center operators must grapple with not only the increased power densities but also the thermal challenges that they present.

Because liquid is many times better at storing and transferring heat than air, liquid cooling solutions can provide immediate and measurable benefits to compute efficiency, density and performance. The use of direct liquid cooled modules can increase compute performance and density and decrease energy consumption.

Electronic component packages are subject to a wide range of temperature differentials. Due to differences in the thermal coefficient of expansion ("CTE") of the various package components, the electronic component package may warp as the temperature of the electronic component package changes.

BRIEF SUMMARY

To control warpage, direct liquid cooled modules including manifolds and stiffeners may be incorporated into the electronic component package. A fluid delivery and exhaust manifold provides direct liquid cooling of a module. The manifold uses spring force based compliance to minimize the bypass liquid flow gaps between flow channels in the form of inlet and outlet channels in the manifold and flow channels in the chip. In one example, the flow channels of the chip may be in the form of microfins or small channels in relation to larger inlet and outlet channels of the manifold. Spring force is used to maintain direct contact between the respective flow channels of the manifold and the microfins on the silicon chip. Pressure differential reduction features are also incorporated into the design of the direct liquid cooled module.

In one aspect, a coolant delivery device includes a manifold having at least one inlet, at least one outlet, and a bottom surface. The bottom surface has a plurality of alternating inlet channels and outlet channels, the inlet channels being directly open to the at least one inlet and the outlet channels being directly open to the at least one outlet. The alternating inlet and outlet channels of the manifold are adapted to directly contact flow channels of a chip. The at least one inlet of the manifold is configured to receive fluid therethrough that is directed to the inlet channels, then to the flow channels of the chip, before being received in the outlet channels and then being expelled though the at least one outlet of the manifold.

In one example, the at least one inlet is a central inlet and the at least one outlet is first and second lateral outlets such that liquid is received in the manifold through the central inlet and is directed out of the manifold through the first and second lateral outlets.

In one example, when the manifold is in direct contact with the chip the alternating inlet channels and outlet channels of the manifold are perpendicular to the flow channels of the chip.

The coolant delivery device may further include at least one housing adapted to receive a resilient member therein, the resilient member configured to maintain contact between the manifold and the chip.

In one example, the resilient member is a spring.

The coolant delivery device may further include a top plate adapted to lie adjacent a top surface of the manifold, the resilient member having first and second ends, the first end contacting the manifold and the second end contacting an inner surface of the top plate.

In another example, the coolant delivery device may further include a stiffener having a central aperture therethrough for receiving the manifold, wherein an enclosure for the manifold is formed when the chip is coupled to a bottom surface of the stiffener and the top plate is coupled to a top surface of the stiffener.

In yet another example, the coolant delivery device may further include an inlet fitting coupled to the top plate is adapted to provide liquid to the at least one inlet of the manifold, and at least one outlet fitting coupled to the top plate is adapted to receive expelled liquid from the at least one outlet of the manifold.

In still yet another example, the coolant delivery device may further include an O-ring adapted to lie within a groove of the stiffener, wherein the O-ring provides a seal between the stiffener and the top plate when the stiffener and top plate are in direct contact with one another.

In still yet another example, the coolant delivery device may further include a sealant adapted to bond the stiffener and chip when the stiffener is in direct contact with the chip.

In another aspect, a coolant delivery device includes a manifold having at least one inlet, at least one outlet, a housing and a bottom surface with a plurality of alternating flow channels in fluid communication with the at least one inlet and the at least one outlet, and a chip having a top surface including a plurality of flow channels. The housing is adapted to receive a resilient member for maintaining contact between the respective plurality of flow channels between the manifold and chip when fluid flows though the manifold from the at least one inlet to the at least one outlet.

In one example, the plurality of flow channels of the manifold include inlet channels and outlet channels, the inlet channels being directly open to the at least one inlet and the outlet channels being directly open to the at least one outlet.

In another example of this aspect, the at least one inlet of the manifold is configured to receive fluid therethrough that is directed to the inlet channels of the manifold, then to the plurality of flow channels in the chip, then to the outlet channels of the manifold and then being expelled though the at least one outlet channel of the manifold.

In yet another example, the at least one inlet is a central inlet and the at least one outlet is first and second lateral outlets such that liquid is received in the manifold through the central inlet and is directed out of the manifold through the first and second lateral outlets.

Another aspect provides for a coolant delivery device, including a first housing and a second housing, each of the first and second housings including a recess sized and shaped to receive a resilient member, and each of the first and second housings including an outlet. The coolant delivery device further includes a base portion extending between the first housing and the second housings, the base portion including at least one inlet, and having a bottom surface including a plurality of alternating inlet channels and outlet channels, the inlet channels being directly open to the at least one inlet and the outlet channels being directly open to the at least one outlet, wherein the at least one inlet is in fluid communication with the inlet channels, the outlet channels, and the at least one outlet.

DETAILED DESCRIPTION

Figure 1A:
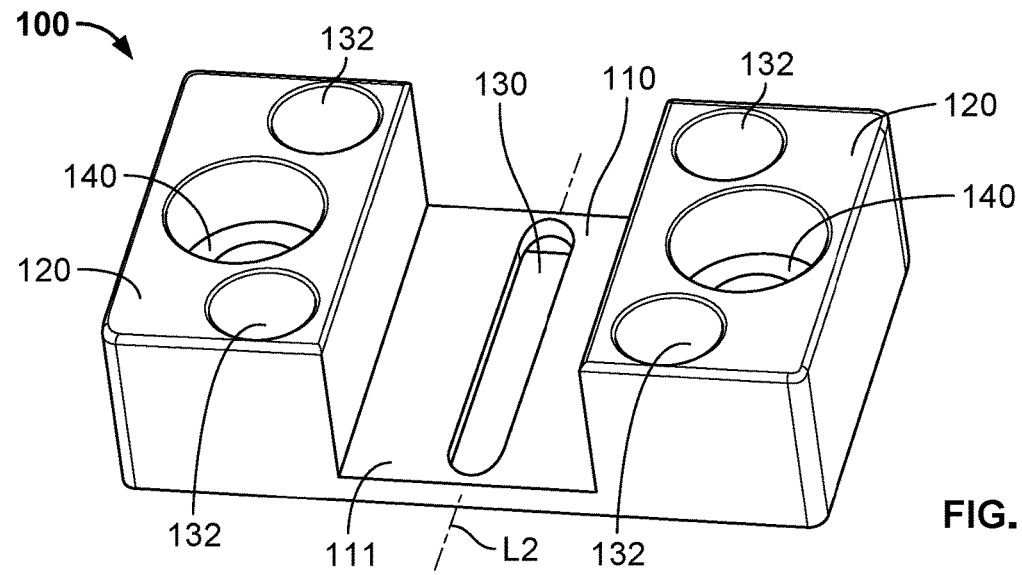
FIG. 1A is a perspective top view of a manifold according to one aspect of the disclosure.

FIG. 1A is a perspective top view of a manifold 100 that is part of a direct liquid cooled module for directing liquid or gas to a chip that manifold 100 sits on top of. Manifold 100 is designed to direct flow over one or more circuit components, such as microprocessors, memory chips, etc., in order to improve heat transfer between the components and the working fluid. Manifold 100 is a component sitting on top of a chip with flow channels that creates a crossflow path for the coolant resulting in improved heat transfer between the chip and the working fluid or gas. In one example, manifold 100 is made of polyurethane. In other examples, manifold 100 may be made of other polymers.

Manifold 100 has a base portion 110 and first and second housing portions 120. Manifold 100 further includes an inlet 130 in base portion 110 and an outlet 140 in each housing portion 120. Each housing portion 120 of manifold 100 includes outlet 140 and two recesses 132 for at least partially housing a resilient member 150, as shown in FIG. 2, in each of the first and second recesses 132.

As further shown in FIG. 1A, base portion 110 has a top surface 111 and a bottom surface 112. Inlet 130 extends though top and bottom surfaces 111, 112. Inlet 130 has a length that extends along longitudinal axis L1. Liquid or gas that flows through inlet 130 of manifold 100 generally flows in a longitudinal direction L2 as shown for example in FIG. 4, which is perpendicular to L1.

Figure 1B:
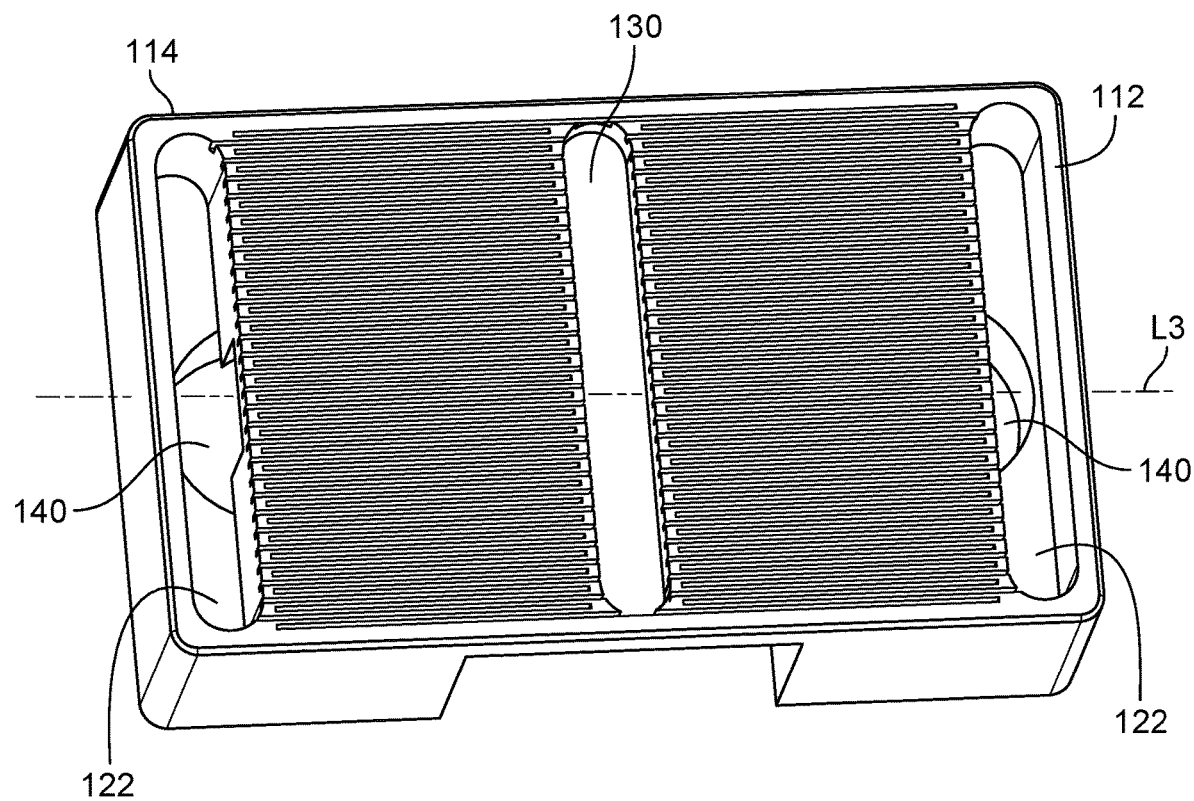
FIG. 1B is a perspective view of the underside of the manifold shown in FIG. 1A.
Figure 5A:
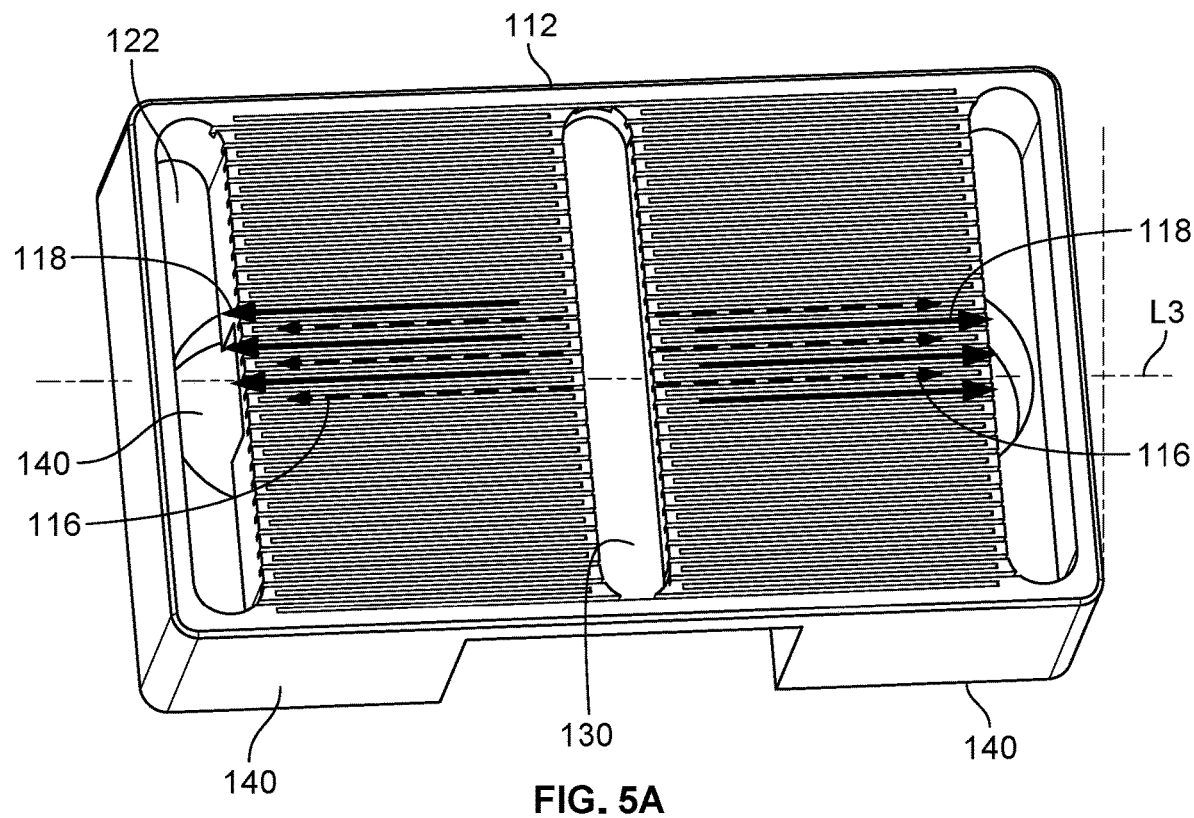
FIG. 5A is a perspective view of the underside or bottom portion of the manifold of FIG. 1 with arrows showing the direction of fluid through respective inlet and outlet flow channels.

The underside of manifold 100 is shown in FIG. 1B. Bottom surface 112 of manifold 100 has a perimeter 114 and an array of flow channels (inlet channels 116 and outlet channels 118 as shown in FIG. 5A) extending along longitudinal axis L3. Longitudinal axis L3 is perpendicular to both longitudinal axes L1 (along the length of intlet 130) and L2 (direction of fluid flow through inlet 130). The flow channels are alternating inlet channels 116 and outlet channels 118 which will be described in greater detail with respect to FIG. 5A. Bottom surface 112 further includes reservoirs 122 that feed outlet channels 118 to outlets 140.

Figure 2:
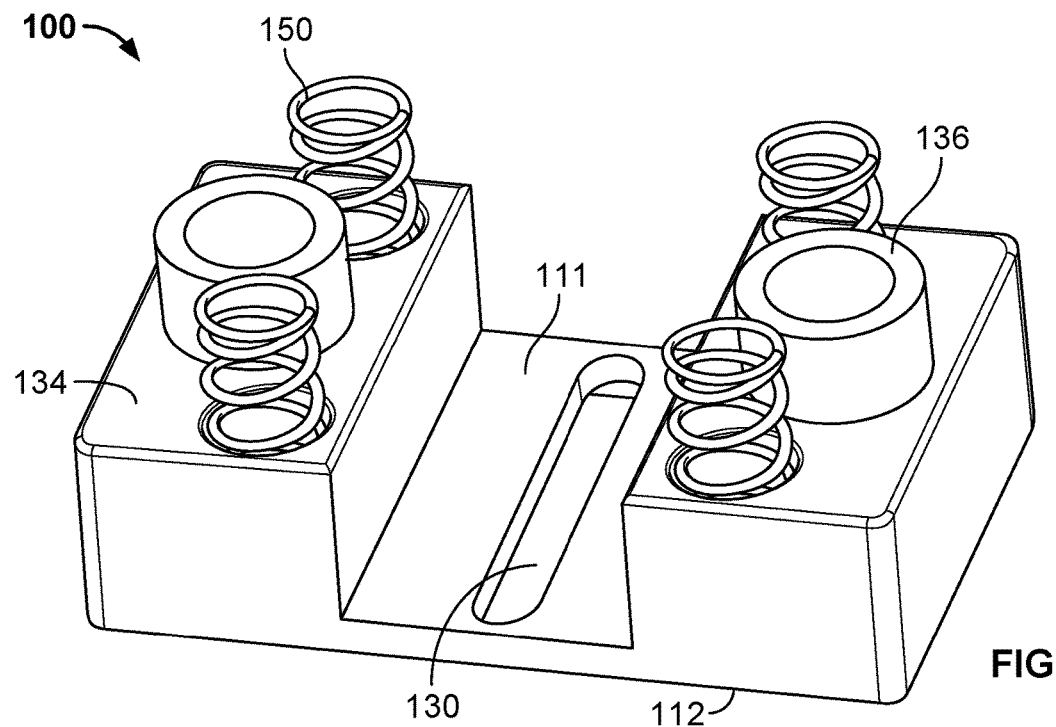
FIG. 2 is another perspective top view of the manifold of FIG. 1 including exemplary resilient members and outlet sleeves in each outlet port.

In FIG. 2, a resilient member 150 in the form of a spring is shown in each recess 132. In this example, there are a total of four resilient members 150 with two resilient members 150 in each housing 120. In another example, there may be more or less than four resilient members used in manifold 100. A portion of each resilient member 150 is within recess 132 and another portion extends out from a top surface 134 of a respective housing 120. A first end 151 of resilient member 150 therefore contacts an inner surface of recess 132, while a second end 153 projects outwardly from the top surface 134 of housing 120. While resilient member 150 is shown as a spring, it can be any resilient structure that can force opposing surfaces the ends thereof are in contact with when the resilient structure is compressed or in a loaded condition.

Each outlet 140 extends through top surface 134 to a respective reservoir 122 in bottom surface 112 of manifold 100. Within each outlet 140, there is a ledge 142 as shown for example in FIG. 10A. A tube or outlet sleeve 136 is at least partially received within each outlet 140 and rests within outlet 140 when in direct contact with ledge 142. In one example, each tube 136 is made of polytetrafluoroethylene ("PTFE") as PTFE has one of the lowest coefficients of friction of any solid. This allows tube 136 to have low friction with the internal circular wall defining outlet 140.

Figure 3A:
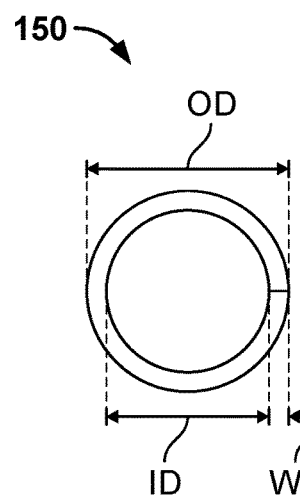
FIG. 3A is a top view of one of the resilient member shown in FIG. 2.
Figure 3B:
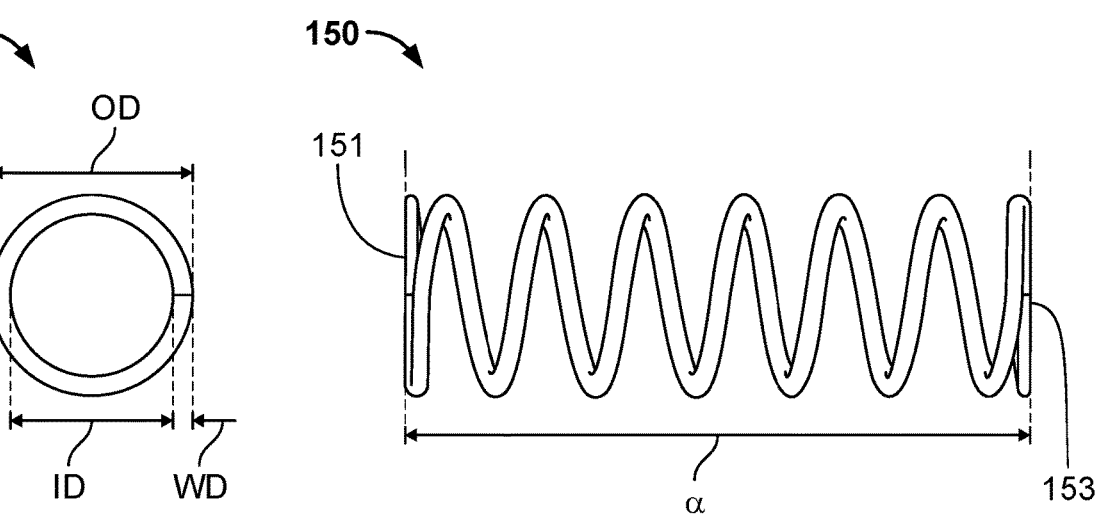
FIG. 3B is a side view of the resilient member shown in FIG. 3A.

As shown in FIG. 3A, spring 150 has an outside diameter ("OD") of 0.24" and a wire diameter ("WD") of 0.022". In this example, the inside diameter ("ID") of spring 150 is 0.196". As shown in FIG. 3B, spring 150 has an overall length ("OL") of 0.75". During use, spring 150 can have a compressed length ("CL") of 0.17" under maximum load. The force of each spring is 2.69 pounds of force ("lbf") for a total of approximately 10.8 lbf for the four springs. The above is just one example of the dimensions for OD, WD, ID, OL and CL and maximum load in lbf that resilient members 150 can have. In other examples, the dimensions and spring force of each resilient member can be based on the needs of the direct cooled module.

Figure 4:
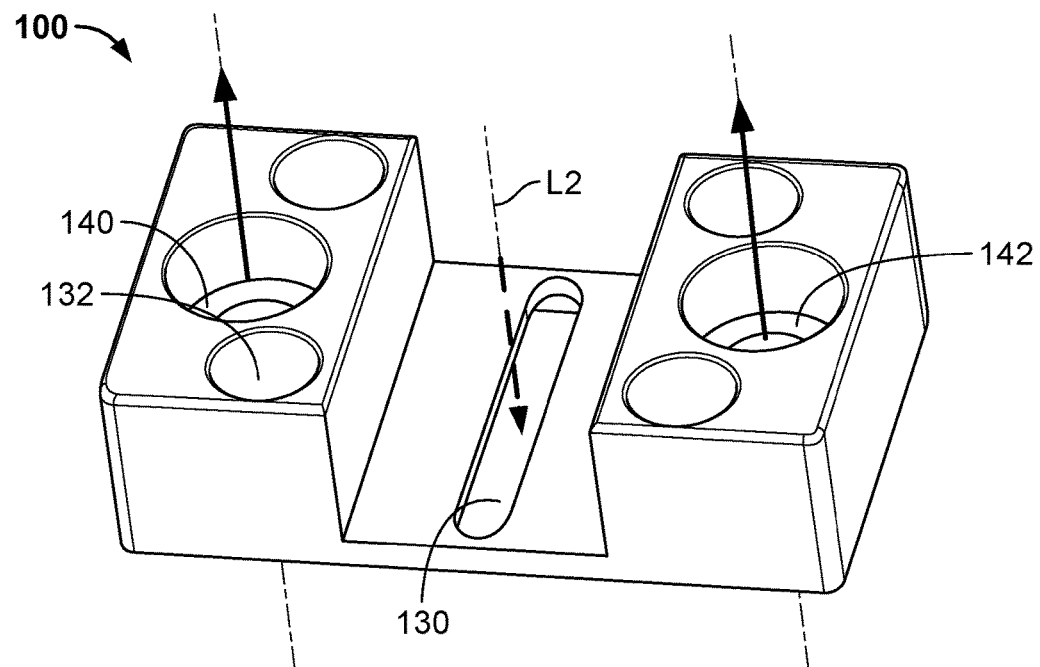
FIG. 4 is another perspective top view of the manifold of FIG. 1 showing the direction of fluid through respective inlet and outlet ports.
Figure 5B:
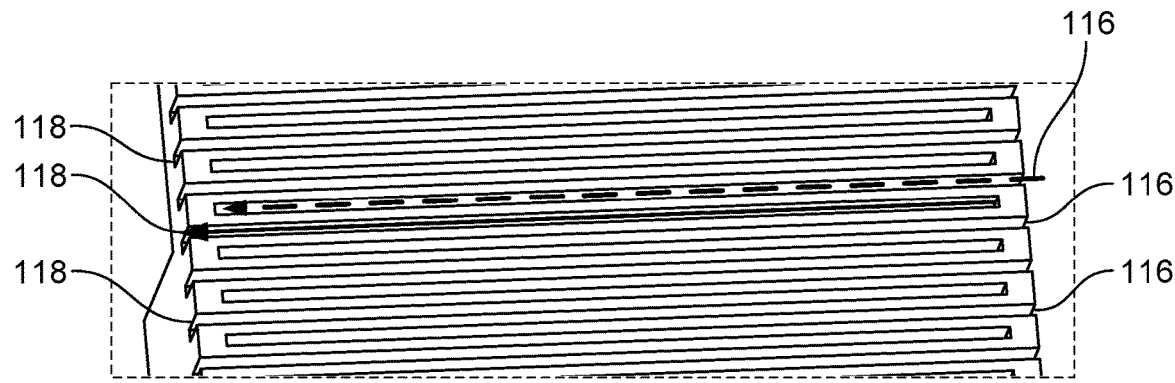
FIG. 5B is an enlarged view of a portion of the flow channels shown in FIG. 5A.

FIG. 4 is another perspective view of manifold 100. As shown, there are respective arrow directions to signify the direction of liquid or gas flow through inlet 130 and outlets 140. Each arrow follows along a path that is generally parallel to longitudinal axis L2. Liquid or gas enters into manifold 100 through inlet 130 from top surface 111 to bottom surface 112 of manifold 100. FIGS. 5A and 5B show the direction of fluid flow in the respective manifold inlet and outlet channels 116, 118. Each of inlet channels 116 are directly open to inlet 130 while each of outlet channels 118 are directly open to outlet 140 via reservoirs 122. In other words, each of inlet channels 116 are in fluid communication with inlet 130 while each of outlet channels 118 are in fluid communication with outlet 140.

Figure 6:
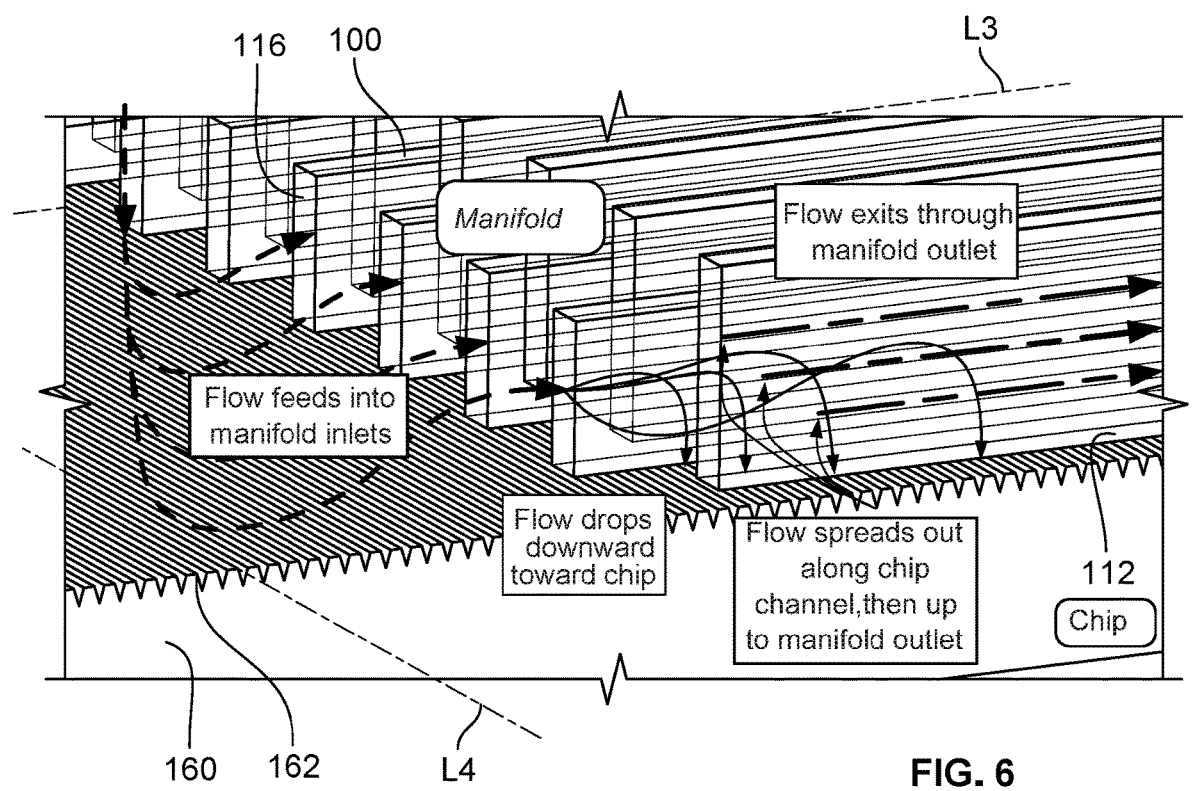
FIG. 6 is a perspective view of an example of a flow path of liquid when a bottom surface of a manifold is in directed contact with a top surface of a chip.
Figure 7A:
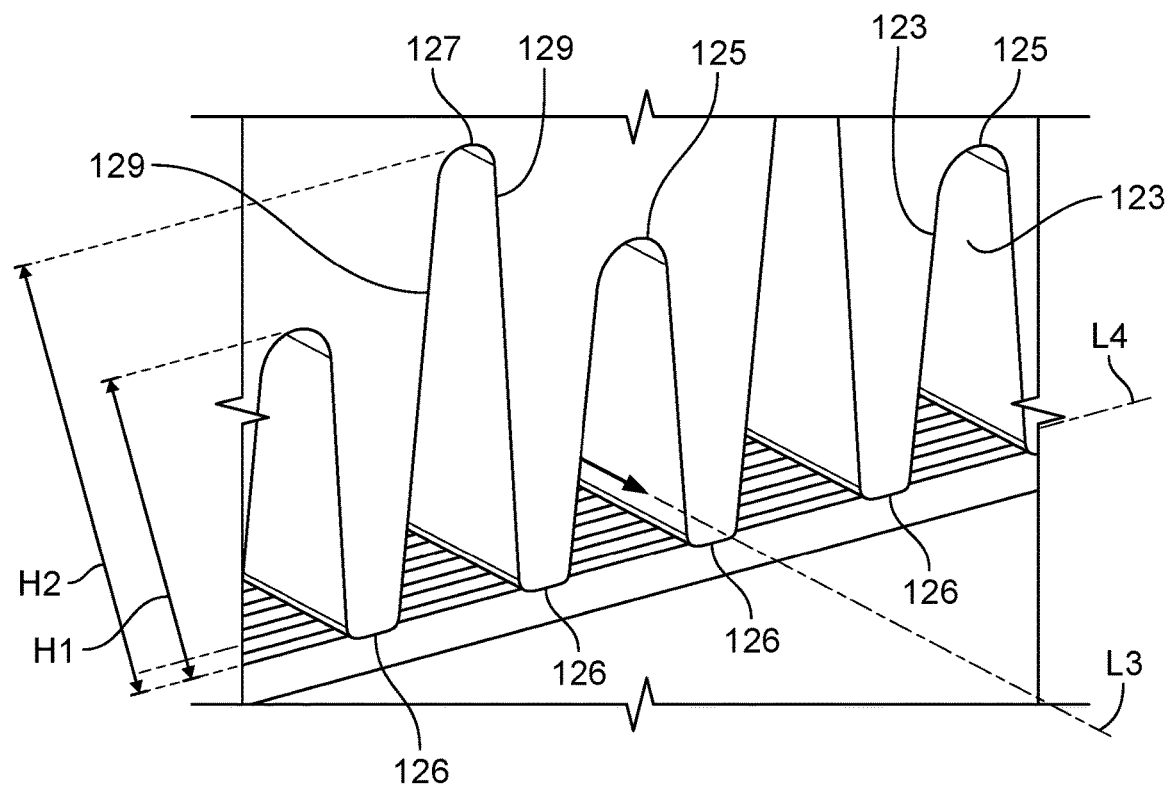
FIG. 7A is an enlarged perspective view of fins of the manifold in direct contact with microfins of the chip and alternating inlets and outlet flow channels in fluid communication with flow channels of the chip.

The flow path of liquid or gas through the system follows designed paths when bottom surface 112 of manifold 100 is in direct contact with a top surface of a substrate and/or chip 160 as shown in FIG. 6. Chip 160 has a plurality of flow channels 162 that are in fluid communication with the respective inlet channels 116 and outlet channels 118 of manifold shown in FIG. 5B when bottom surface 112 of manifold is in direct contact with chip 160. The flow channels 162 of chip 160 extend along a longitudinal axis L4 as shown in FIGS. 6 and 7A. Longitudinal axis L4 is parallel to longitudinal axis L1 of inlet 130. Longitudinal axis L4 is also perpendicular to longitudinal axis L3, which each of inlet channels 116 and outlet channels 118 are parallel to. As further shown in FIG. 6, fluid that enters manifold 100 is initially fed into inlet channels 116 and then drops down into flow channels 162 of chip 160.

Figure 7B:
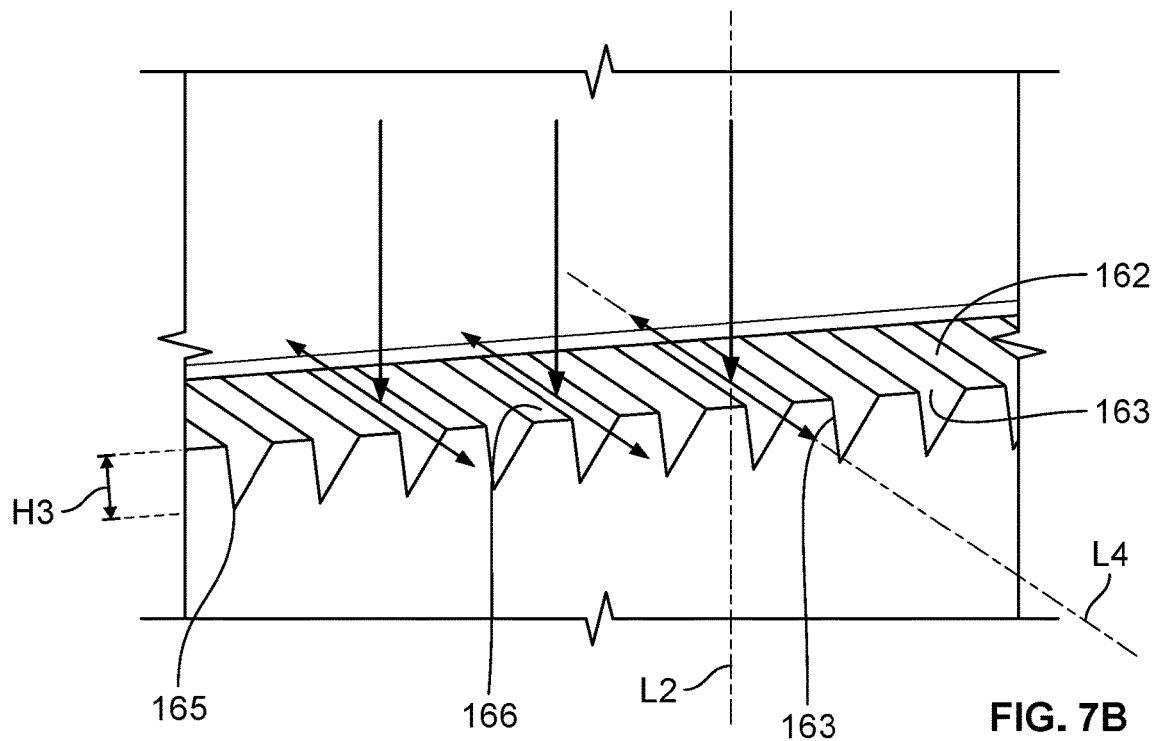
FIG. 7B is an enlarged perspective view of the enlarged perspective view of FIG. 7A rotated 90° with arrows indicating the flow path of fluid in an inlet channel of the manifold down into respective microfins of the chip.

As shown in FIGS. 7A-7B, between each inlet channel 116 and outlet channel 118 of manifold 100 is an end face 126. Between each flow channel 162 of chip 160 is an end face 166. When bottom surface 112 of manifold 100 is in direct contact with chip 160, respective end faces 126, 166 of manifold 100 and chip 160 are in direct contact with one another. After fluid that enters manifold 100 through inlet 130 along axis L2 and is then fed into inlet channels 116 along axis L3, the fluid then drops down into flow channels 162 of chip 160 along axis L2, and then flows along axis L4 within flow channels 162 as it passes under one or more contact points formed by the intersection of ends faces 126, 166, before rising upward or vertically along axis L2 again and into outlet channels 118 along axis L3 and eventually into one of reservoirs 122 at an end of each outlet channel 118, which are directly open to outlet channels 118.

As shown in FIG. 7A, each inlet channel 116 has tapered walls 123 and a roof 125. In the example shown, each roof 125 is rounded. In other examples, the configuration of tapered walls 123 and roof 125 of each inlet channel 116 may be configured based on desired fluid dynamics. The angle of adjacent tapered walls 123 and the curve of 125 may be adjusted as desired to enhance fluid flow through inlet channel 116. Each outlet channel 118 has tapered walls 129 and a roof 127. In the example shown, each roof 127 is rounded. The configuration of tapered walls 129 and roof 125 of each outlet channel 118 may also be designed based on preferred fluid dynamics. For example, the angle of adjacent tapered walls 129 and the curve of roof 127 may be adjusted as desired to enhance fluid flow through outlet channel 118. Each inlet channel 116 has a height H1 defined as a longitudinal distance between a point between adjacent end faces 126 and the apex of roof 125 between the adjacent end faces 126. Each outlet channel 118 has a height H2 defined as a longitudinal distance between a point between adjacent end faces 126 and the apex of roof 127 between the adjacent end faces 126. In the example shown, H2 is greater than H1. In another example, H1 may be greater than H2, and in another example, H1 and H2 may be equal.

As further shown in FIG. 7B, each flow channel 162 has tapered walls 163 and a base 165. In the example shown, each base 165 comes to a point as tapered walls 163 come together. The configuration of tapered walls 163 and base 125 of each flow channel 162 may also be designed based on preferred fluid dynamics. The angle of adjacent tapered walls 163 may be adjusted as desired to enhance fluid flow through flow channel 162. In other examples, base 165 may be curved. Each flow channel 162 has a height H2 defined as a longitudinal distance between a point between adjacent end faces 166 and the nadir of base 165 between the adjacent end faces 166. In the example shown, H3 is the same for each flow channel 162. In another example, one or more flow channels may have a height larger than H3, and in another example, one or more flow channels may have a height less than H3.

Figure 8:
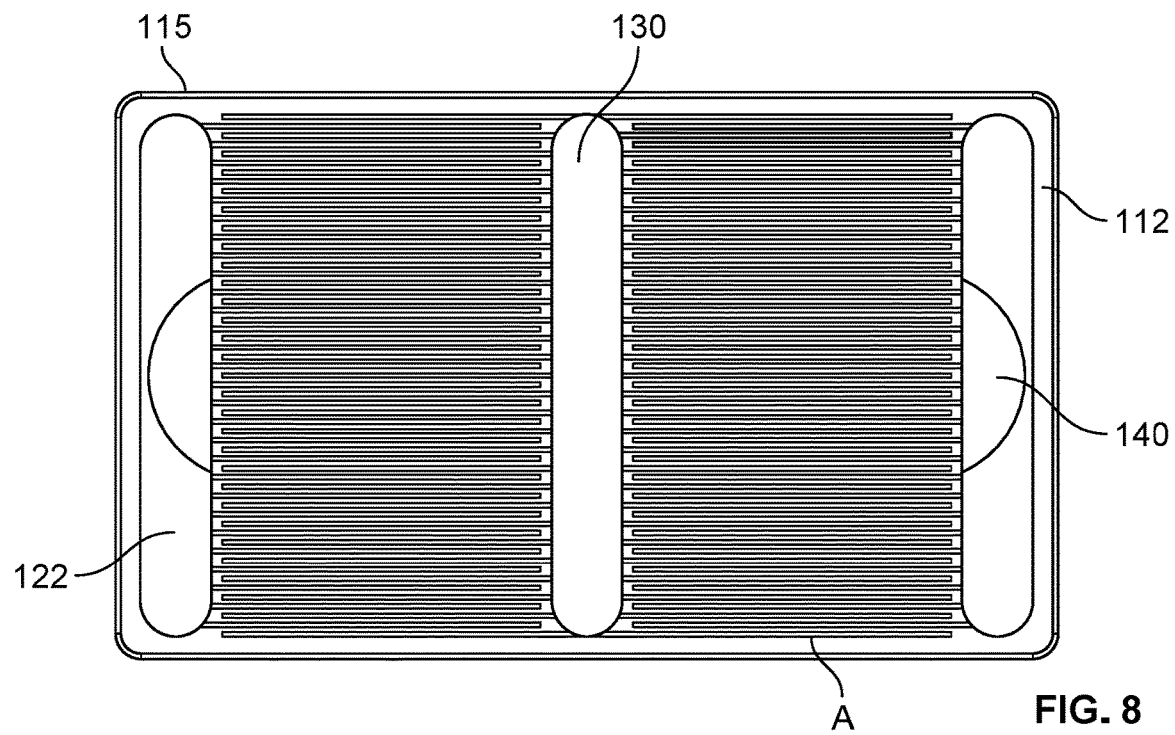
FIG. 8 is a bottom plan view of an exemplary manifold showing an area of the underside of the manifold that contacts a chip and/or substrate when in direct contact with the chip and/or substrate.
Figure 9:
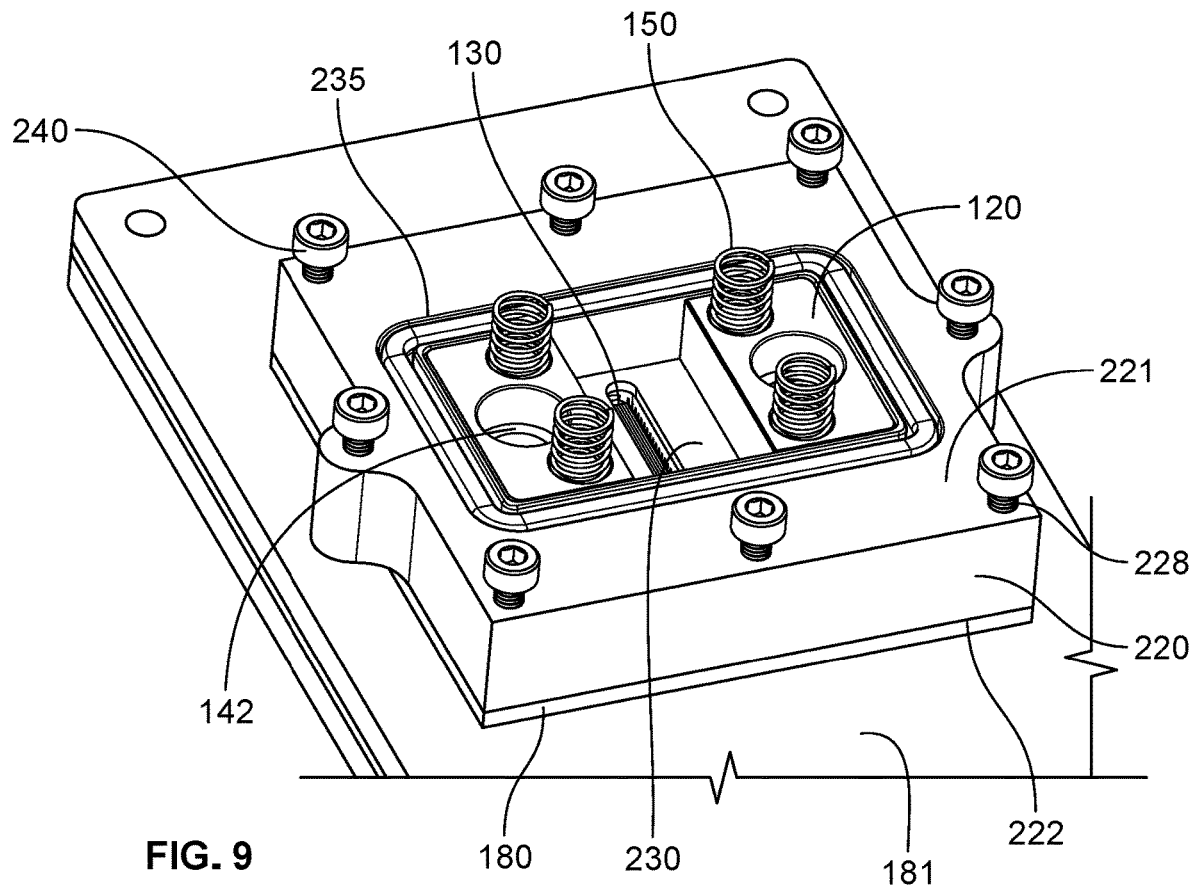
FIG. 9 is a perspective view of a subassembly including a chip on a substrate, a stiffener and a manifold within a central opening of the stiffener and sitting on top of the chip.

FIG. 8 is a bottom plan view of manifold 100 showing a highlighted area A of bottom surface 112 or underside of manifold 100. This area A is the portion of manifold 100 that imparts a load on chip 160 when manifold 100 comes in contact with a substrate 180 and/or chip 160 as shown in FIG. 9. Area A surrounds perimeter 115 of bottom surface 112 of manifold such that the portion of bottom surface 112 of manifold 100 in which the inlet channels 116 and outlet channels 118 are located do not impart a load on chip 160. In one example, the contact area A is 0.161 square inches. This area A is designed to match system pressure on chip 160. The aforementioned spring load is 10.8 lbf or approximately 67 psi on chip 160.

In other examples, the contact area A of manifold 100 may be more or less than 0.161 square inches, and therefore, the spring load of resilient members 150 may also be more or less so that the contact area A matches system pressure on chip 160.

FIG. 9 is a perspective view of a subassembly 200 including a chip 160 on substrate 180 and a stiffener 220. Manifold 100 is housed within a central opening 230 of stiffener 220 and sits on top of chip 160 as shown for example in FIGS. 10A and 10B. Stiffener has a top surface 221 and a bottom surface 222. Bottom surface 222 is either in contact with top surface 181 of substrate 180 or top surface of chip 160. There is a rectangular groove 224 in the top surface 221 of stiffener 220. An O-ring or gasket 235 sits within groove 224.

Substrate 180 includes die or chip 160. Die 160 may be an integrated circuit ("IC") chip, system on chip ("SoC"), or portion thereof, that may include various passive and active microelectronic devices such as resistors, capacitors, inductors, diodes, metal-oxide semiconductor field effect ("MOSFET") transistors, CMOS transistors, bipolar junction transistors ("BJTs"), laterally diffused metal-oxide-silicon ("LDMOS") transistors, high power MOS transistors, other types of transistors, or other types of devices. The die 160 may comprise a memory device, a logic device, or other types of circuits, as examples. Die 160 is shown bonded to a carrier substrate or substrate 180. Substrate 180 can be, for example, a silicon substrate, a plastic substrate, a flexible substrate having polyimide and copper layers for example, a laminate substrate, a ceramic substrate, an interposer, or any other suitable support structure.

According to some examples, prior to bonding top surface 183 of substrate 180 to bottom surface 222 of stiffener 220, a layer of adhesive 182 may be applied to top surface 181 of substrate 180 and/or the bottom surface 222 of stiffener 220. The adhesive 182 is used to mechanically couple substrate 180 and stiffener 220. Any type of adhesive used in the industry including but not limited to natural adhesive, synthetic adhesive, drying adhesives, thermoplastic adhesives, reactive adhesives, pressure sensitive adhesives, or any other commonly used adhesive may be used.

Figure 10A:
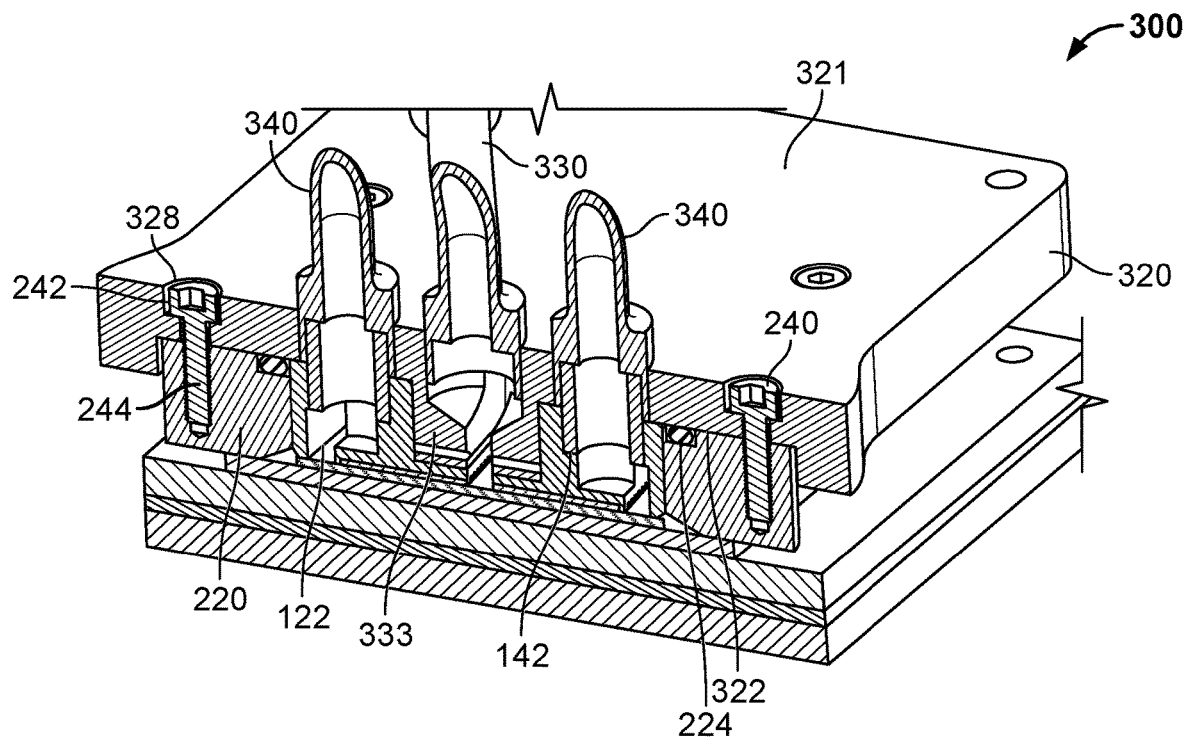
FIG. 10A is a cross-sectional perspective view of a direct liquid cooling module including the subassembly of FIG. 9, and top plate and inlet and outlet fittings.

FIG. 9 also shows hardware or fasteners 240 installed through each of peripheral apertures 228 of stiffener 220. Each fastener or hardware 240 has a top portion 242 and a threaded shaft portion 244. As shown in FIG. 10A, fasteners 240 are used to couple top plate 320 to stiffener 220. In the present example, there are eight fasteners 240. In other examples, there may be more or less than eight fasteners 240 that are used to couple top plate 320 to stiffener. Top plate 320 has a top surface 321 and a bottom surface 322.

Figure 11A:
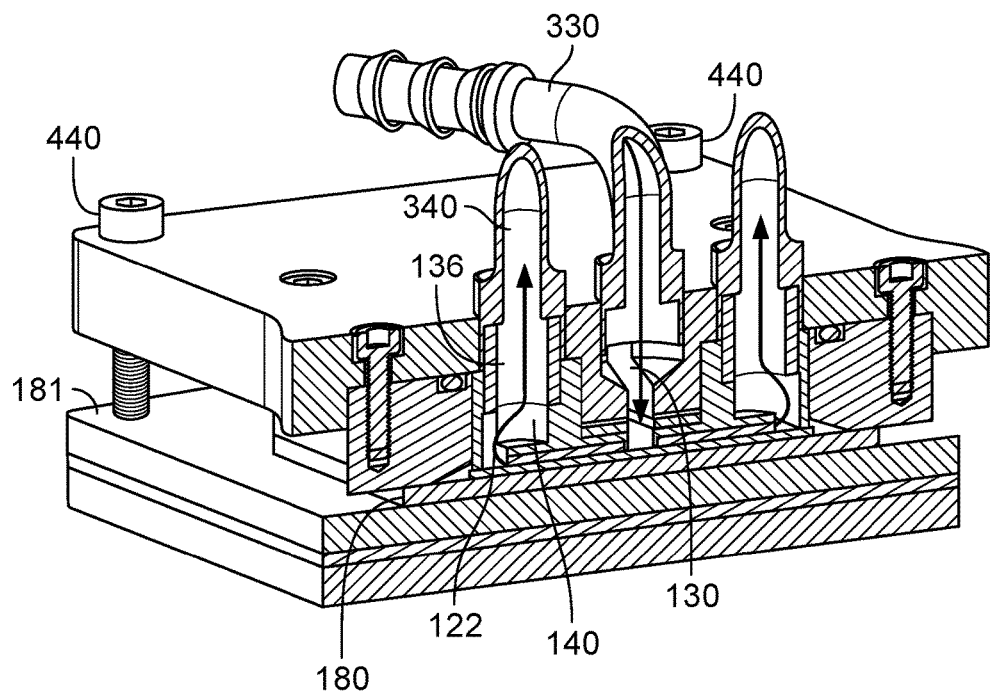
FIG. 11A is a cross-sectional perspective view of the flow path of liquid through the direct liquid cooling module of FIG. 10A.

When top plate 320 is coupled to stiffener 220 as shown in FIG. 10A, for example, a second end of each spring 150 comes into contact with a bottom surface 322 of top plate. A fastener 240 is inserted into each peripheral aperture 328 extending through top surface 321 and bottom surface 322 of top plate 320 such that threaded shaft portion 244 of each fastener 240 is received within threaded peripheral apertures 228 of stiffener 220. As each fastener 240 is threaded into peripheral apertures 228 of stiffener 220, each spring 150 continues to compress until bottom surface 322 of top plate 320 is brought into contact with top surface 221 of stiffener 220. Because a portion of each spring 150 projects upwardly from manifold 100, a second end 153 of each spring 150 also comes into contact with bottom surface 322 of top plate 320. This also causes contact area A of manifold 110 to apply a load onto chip 160 and/or substrate 180. O-ring 235 assists in sealing top plate 320 to stiffener 220. Additional fasteners 440 are used to secure top plate 320 to substrate 180 or an additional substrate 181. While the cross-sectional view of FIG. 11A shows two fasteners 440, a total of four fasteners 440 may be used to secure top plate 320 to substrate 180 or additional substrate 181. In other examples, there may be more or less than four fasteners 440.

Figure 10B:
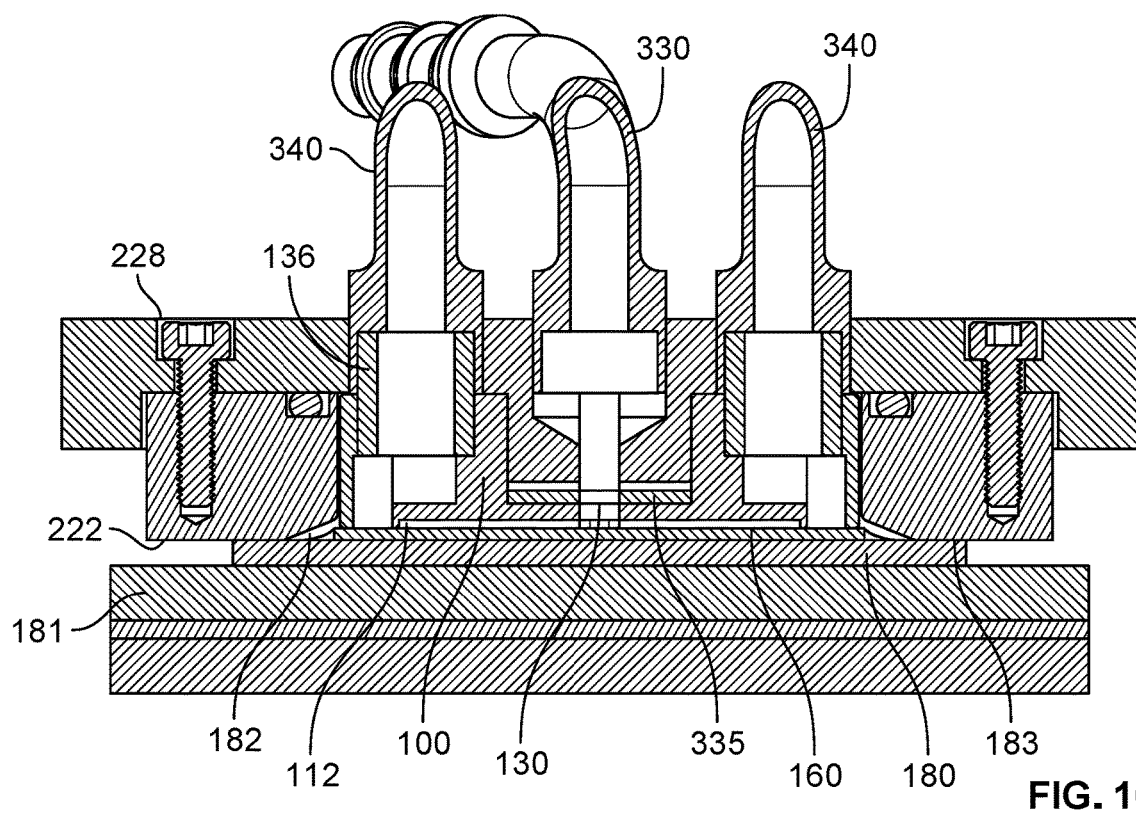
FIG. 10B is a front cross-sectional perspective view of the direct liquid cooling module of FIG. 10A.

FIGS. 10A and 10B further show inlet fitting 330 and outlet fittings 340 coupled to top plate 320. PTFE tubes 136 provide sliding sealing from manifold 110 to outlet fittings 340. Top plate 320 further includes an inlet portion 333 that is received within the space between manifold housings 120. An ultrasoft gasket 335 seals a majority of flow from intlet fitting 330 to inlet 130 of manifold 110.

Figure 11B:
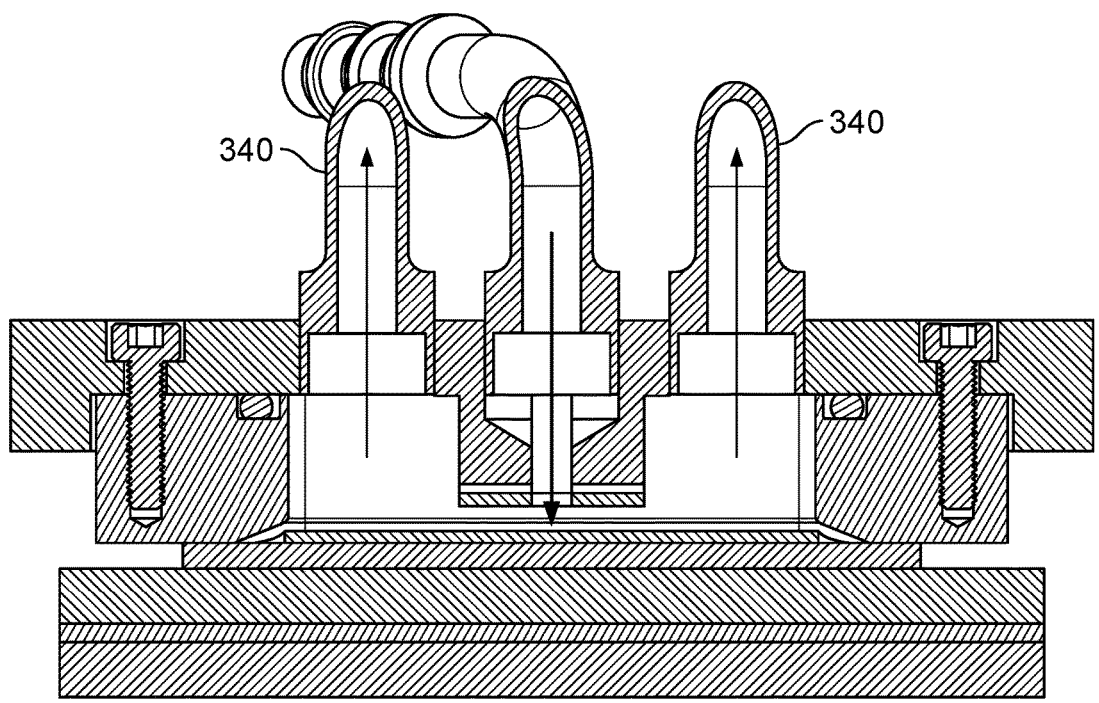
FIG. 11B is a front cross-sectional perspective view of the flow path of liquid through the direct liquid cooling module of FIG. 10A.

FIGS. 11A and 11B show the flow path of the majority of fluid through the system. Fluid enters the system through inlet fitting 330 and through inlet 130 of manifold 100. It then travels through inlet channels 116, then downwards into chip flow channels 162, then back upward into outlet channels 118, into reservoirs 122 and then further upwards into outlets 140 of manifold 110 and through PTFE tubes 136 and further upwards into outlet fittings 340 and out of the direct liquid cooled module.

Figure 12A:
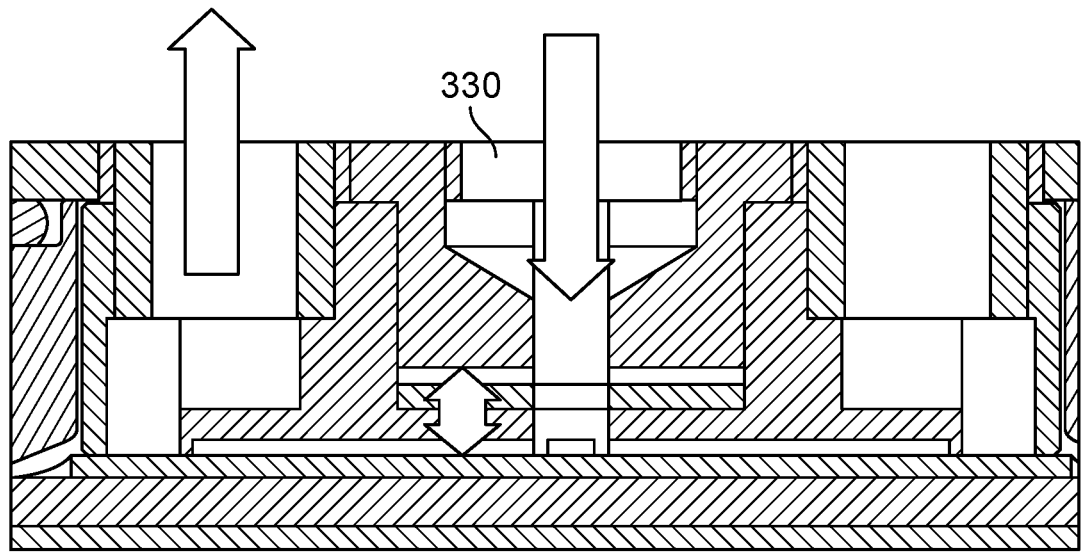
FIG. 12A is a front cross-sectional view of fluid pressure differential through a direct liquid cooling module.
Figure 12B:
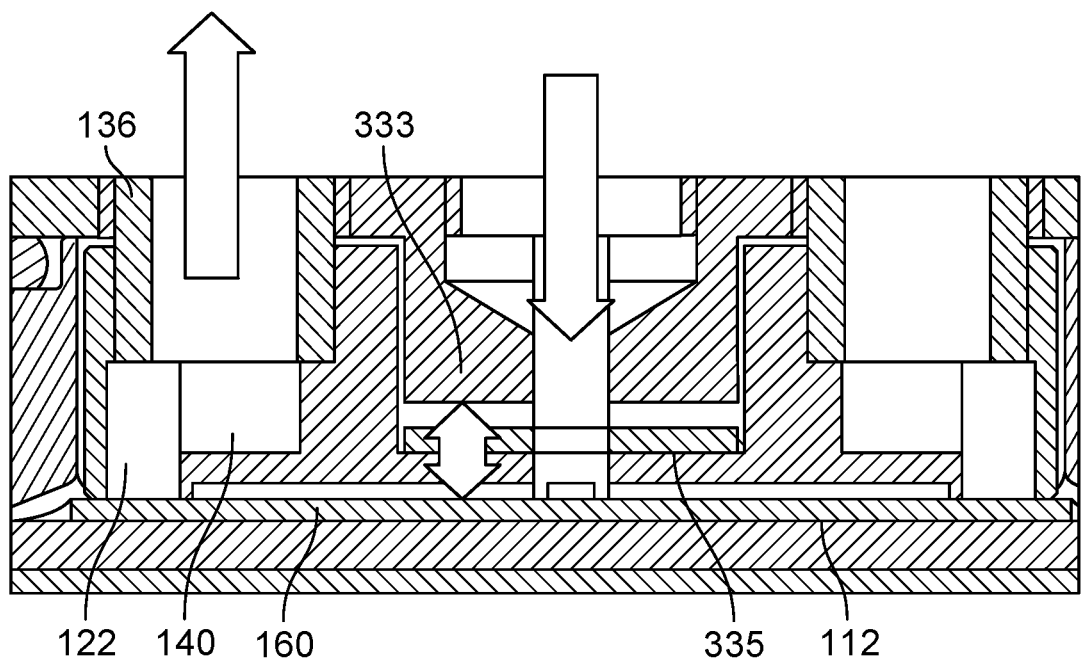
FIG. 12B is a front cross-section view of the direct liquid cooling module with liquid through the module.

FIGS. 12A and 12B show the pressure differential in the inflow and outflow portions of the system. Each of the inflow and outflow portions of the system are hermetically sealed or air-tight such that no air or fluid can escape the package other than through the respective inlet and outlet fittings 330, 340. In one example, fluid flows into the system at 60 psi through inlet fitting 330 and leaves the system at 58 psi through the outlet fittings 340. Therefore, there is a 2 psi difference between the inflow and each outflow portion of the system. Because the system is hermetically sealed, to account for this difference the internal sealing of the system is designed to allow some fluid to flow through the system other than the designed flow path of the majority of the fluid from the inlet fitting 330 through manifold 100 and to the outlet fittings 340. As shown in FIG. 12B, a small amount of fluid does not pass through manifold 110, but instead between gasket 335 and inlet portion 333 of top plate 330, between manifold housings 120 and inlet portion 333 and bottom surface 322 of top plate which relieves the pressure differential between fluid entering the system and fluid being expelled from the system.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible implementations. Further, the same reference numbers in different drawings can identify the same or similar elements.

The invention claimed is:

1. A coolant delivery device comprising:
   a manifold having at least one inlet, at least one outlet, a top surface, and a bottom surface opposite the top surface, the bottom surface configured to be positioned directly over a chip, the at least one inlet extends through the top surface and the bottom surface,
   at least one housing adapted to receive a resilient member therein, the resilient member configured to maintain contact between the manifold and the chip, and
   a top plate adapted to lie adjacent a top surface of the manifold, the resilient member having first and second ends, the first end contacting the manifold and the second end contacting an inner surface of the top plate,
   wherein the bottom surface has a plurality of alternating inlet channels and outlet channels, and an opening to a reservoir extending from the bottom surface, the inlet channels being directly open to the at least one inlet and the outlet channels being directly open to the at least one outlet via the opening and the reservoir,
   wherein the alternating inlet and outlet channels of the manifold are adapted to directly contact flow channels of the chip, and
   wherein the at least one inlet of the manifold is configured to receive fluid therethrough that is directed to the inlet channels, then to the flow channels of the chip, before being received in the outlet channels and then being expelled though the at least one outlet of the manifold.

2. The coolant delivery device of claim 1, wherein the at least one inlet is a central inlet and the at least one outlet is first and second lateral outlets such that liquid is received in the manifold through the central inlet and is directed out of the manifold through the first and second lateral outlets.

3. The coolant delivery device of claim 1, wherein when the manifold is in direct contact with the chip the alternating inlet channels and outlet channels of the manifold are perpendicular to the flow channels of the chip.

4. The coolant delivery device of claim 1, wherein the resilient member is a spring.

5. A coolant delivery device comprising:
 a manifold having at least one inlet, at least one outlet, and a bottom surface,
 wherein the bottom surface has a plurality of alternating inlet channels and outlet channels, the inlet channels being directly open to the at least one inlet and the outlet channels being directly open to the at least one outlet,
 wherein the alternating inlet and outlet channels of the manifold are adapted to directly contact flow channels of a chip, and
 wherein the at least one inlet of the manifold is configured to receive fluid therethrough that is directed to the inlet channels, then to the flow channels of the chip, before being received in the outlet channels and then being expelled though the at least one outlet of the manifold,
 the delivery device further comprising:
  a top plate adapted to lie adjacent a top surface of the manifold; and
  a stiffener having a central aperture therethrough, the central aperture sized and shaped to receive the manifold,
 wherein an enclosure for the manifold is formed when a chip is coupled to a bottom surface of the stiffener and the top plate is coupled to a top surface of the stiffener.

6. The coolant delivery device of claim 5, further comprising:
 an inlet fitting coupled to the top plate, is the inlet fitting adapted to provide liquid to the at least one inlet of the manifold; and
 at least one outlet fitting coupled to the top plate, the outlet fitting adapted to receive expelled liquid from the at least one outlet of the manifold.

7. The coolant delivery device of claim 5, further comprising:
 an O-ring adapted to lie within a groove of the stiffener,
 wherein the O-ring provides a seal between the stiffener and the top plate when the stiffener and top plate are in direct contact with one another.

* * * * *